United States Patent
Yang et al.

(10) Patent No.: US 7,603,095 B2
(45) Date of Patent: Oct. 13, 2009

(54) APPARATUS AND METHOD OF SWITCHING INTERVALS

(75) Inventors: Chia-hao Yang, Douliou (TW); Chia-jung Liu, Banciao (TW)

(73) Assignee: Silicon Integrated Systems Corp., Hsinchu (TW)

( * ) Notice: Subject to any disclaimer, the term of this patent is extended or adjusted under 35 U.S.C. 154(b) by 856 days.

(21) Appl. No.: 11/356,931

(22) Filed: Feb. 17, 2006

(65) Prior Publication Data

US 2007/0197181 A1    Aug. 23, 2007

(51) Int. Cl.
*H04B 1/06* (2006.01)
(52) U.S. Cl. ............ 455/260; 455/147; 455/165.1; 455/255; 455/318; 455/265; 327/149; 327/156; 327/158; 327/276; 327/291; 375/221; 375/376; 375/327; 331/2; 331/16; 331/25; 331/57; 331/179
(58) Field of Classification Search ............ 455/118, 455/147, 165.1, 255, 260, 76, 318, 265; 375/221, 375/376, 327; 327/149, 156, 158, 276, 291; 331/16, 2, 25, 57, 179
See application file for complete search history.

(56) References Cited

U.S. PATENT DOCUMENTS

| | | | |
|---|---|---|---|
| 6,304,119 B1 | 10/2001 | Tseng et al. | |
| 6,489,824 B2 * | 12/2002 | Miyazaki et al. | ............ 327/158 |
| 2005/0189974 A1 | 9/2005 | Chao | |
| 2005/0258906 A1 | 11/2005 | Su et al. | |
| 2006/0145741 A1 * | 7/2006 | Panpalia et al. | ............. 327/158 |

FOREIGN PATENT DOCUMENTS

| | | | |
|---|---|---|---|
| TW | 200539576 A | | 12/2005 |
| TW | 200729735 A | * | 1/2006 |

\* cited by examiner

*Primary Examiner*—Edward Urban
*Assistant Examiner*—Junpeng Chen

(57) ABSTRACT

The present invention provides a way of hysteretic switching for efficiently reducing the heavy switching between two adjacent coarse intervals. The present invention disposes a number of fine intervals to cover a range which is larger than the length of one coarse interval. Each coarse interval comprises some extra fine intervals which are exceeded the boundary of the coarse intervals in one side. The heavy switching will be postponed until the extra fine intervals are used up. In the meantime, the fine calibration unit records the number of extra fine interval which be used. An extra-boundary value will be recorded in the fine calibration unit for determining an initial fine interval in another coarse interval if the heavy switching occurs. It should be noted that the extra-boundary value could be a positive or minus value corresponding to which a forward coarse interval or a backward coarse interval the reference signal drifts into. The present invention also provides a method for reducing heavy switching between two coarse intervals. It is obvious that the probability of the heavy switching occurring will be efficiently decreased by the way of hysteretic switching of the present invention. Furthermore, the mismatch and noises due to the heavy switching between the coarse intervals can be effectively diminished.

30 Claims, 10 Drawing Sheets

APPARATUS AND METHOD OF SWITCHING INTERVALS

FIELD OF THE INVENTION

The present invention generally relates to an apparatus and a method of switching intervals, and more particularly, to an apparatus and a method of reducing heavy switching with a dual loop of a hybrid phase and time domain for clock source synchronization in electronic devices.

BACKGROUND OF THE INVENTION

FIG. 1 shows a conventional block diagram of controlling a clock phase alignment in a delay-locked loop (DLL). The DLL includes a phase-interpolated calibration unit 100, a phase detector 102, and a controller 104. The phase-interpolated calibration unit 100 is capable of receiving an input signal (not shown) and calibrates the phase of the input signal according to a reference signal in a phase domain. The phase detector 102 then detects the phase difference between a feedback signal of the phase-interpolated calibration unit 100 and the reference signal. Thereafter, the controller 104 receives the detecting results of the phase detector 102 and is necessarily required to control the phase-interpolated calibration unit 100 by an angular magnitude in the phase domain. The phase-interpolated calibration unit 100 repeatedly adjusts the phase of the feedback signal toward that of the reference signal by interpolating the phase of the feedback signal according to a control signal from the controller 104 until the phase alignment between the feedback signal and the reference signal is achieved.

However, since the phase alignment of the feedback signal to the reference signal is performed in the phase domain by interpolation, the phase-interpolated calibration unit 100 requires large power consumption. The implementation of the phase interpolation utilizes complicated current conversions for the signals when the feedback signal is interpolated to the reference signal. Particularly, while the current signal converted from the signal is quite small, additional circuits are required to solve the situation. Therefore, there is a need to additionally raise the size of the circuit so that the layout of the circuit is complicated and the cost of the clock source synchronization is increased as a result.

Moreover, in the prior art, a phase-locked loop (PLL) is usually used in the clock source synchronization; because the size of the PLL circuit is too large, thereby resulting in high-noise. In addition, the circuit layout of the PLL must be re-designed to downgrade the stability of the circuit since the manufacturing process of the PLL is changed.

Furthermore, the conventional DLL calibrates the clock phase by utilizing a plurality of phase intervals to cover a whole 360 degrees in phase domain, wherein every phase interval does not overlap with adjacent phase intervals. It causes a problem of that the controller has to change current phase interval to align the feedback signal with the reference signal when the reference signal is located just on the boundary of two adjacent phase intervals. The frequently switching between two different phase intervals, i.e. so-called heavy switching, would easily invite the mismatch between two phase intervals and noises in the DLL. The mismatch and noises could occur in the DLL due to the inherent imperfections during manufacturing process or interferences from outside of the electronic device. As a result, the frequent heavy switching will degrade the performance of the DLL.

As aforementioned, conventional DLL which calibrates the clock phase in a phase domain cannot afford the demand of different synchronization sources. The usage of PLL in synchronization source is also subjected to noise and circuit size. Further, the frequent heavy switching of conventional DLL is adverse to the performance of DLL. Consequently, there is a need to provide a novel delay-locked loop for the synchronization source to provide the electronic devices with a preferred clock phase adjustment of the feedback and the reference signal for reducing the cost and increasing operation efficiency.

SUMMARY OF THE INVENTION

A primary object of the present invention is to provide an apparatus and a method of switching intervals for reducing heavy switching between two adjacent intervals.

Another object of the present invention is to provide an apparatus and a method of reducing heavy switching with a hybrid phase and time domain for clock source synchronization.

A still object of the present invention is to provide an apparatus and a method of reducing heavy switching for diminish the imperfections due to the manufacturing process and the interferences from outside of the electronic device.

According to the above objects, the present invention sets forth an apparatus and a method of reducing heavy switching between two adjacent intervals.

A fine calibration unit comprises a plurality of delay cells. The number of delay cells is preset in the fine calibration unit of the apparatus. Each delay cell is capable of representing a fine interval within a phase interval. The fine calibration unit receives an output signal from a coarse calibration unit to determine in which specific phase interval a reference signal is located. The fine calibration unit also receives a control signal from a controller to determine whether a feedback signal is aligned with the reference signal. The fine calibration will add one delay length in time domain to the feedback signal each time when the feedback signal lags the reference signal. On the contrary, the fine calibration will subtract one delay length in time domain from the feedback signal each time when the feedback signal leads the reference signal. It will be repeated over and over until the feedback signal locks the reference signal.

The present invention provides a way of hysteretic switching for efficiently reducing the heavy switching between two adjacent coarse intervals. The present invention disposes a number of the fine intervals to cover a range which is larger than the length of one coarse interval. Each coarse interval comprises some extra fine intervals which are exceeded the boundary of the coarse intervals in one side. The heavy switching will be postponed until the extra fine intervals are used up. In the meantime, the fine calibration unit records the number of extra fine interval which be used. An extra-boundary value will be recorded in the fine calibration unit for determining an initial fine interval in another coarse interval if the heavy switching occurs. It should be noted that the extra-boundary value could be a positive or minus value corresponding to whichever forward coarse interval or backward coarse interval the reference signal drifts. It is obviously that the probability of the heavy switching occurring will be efficiently decreased by the way of hysteretic switching of the present invention. Furthermore, the mismatch and noises due to the heavy switching between the coarse intervals can be effectively diminished.

The present invention still provides a method for reducing heavy switching between two coarse intervals, comprising following steps:

Step 1 Generating a plurality of output signals in a coarse calibration unit and every two output signals have a phase interval therebetween;

Step 2 Delaying one of the output signals generated in a fine calibration unit by coupling a programmable delay circuit in a time domain to adjust a phase of a feedback signal toward a phase of reference signal;

Step 3 Detecting a phase difference between the reference signal and the feedback signal by a phase detector for outputting an indicating signal corresponding to the phase difference between the reference and feedback signals;

Step 4 Adjusting the delay length of the feedback signal by increasing or decreasing the usage of the number of delay cells in the fine calibration unit according to the indicating signal from the phase detector;

Step 5 Determining whether the usage of delay cells is out of current hysteretic boundary of coarse interval. If the usage of delay cells is out of current hysteretic boundary of coarse interval, go forward to Step 6, otherwise go forward to Step 8;

Step 6 Switching the phase of the feedback signal to an adjacent phase interval by selecting one of the output signals from the coarse calibration unit;

Step 7 Adding the extra-boundary value to the new coarse interval of the feedback signal for compensating the extra fine intervals have been used in the former coarse interval, and go backward to Step 4;

Step 8 Determining whether the feedback signal is aligned with the reference signal;

Step 9 Continuously tracking an alignment status between the reference and feedback signals.

The apparatus and method according to the present invention can efficiently reducing the heavy switching without additional costs. Although the present invention sets forth a preferred embodiment to clarify the spirit of the present invention, the present invention also can be implemented in similar scopes of electronic device design, such as a digital-to-analog converter, which is need to switching signals from a larger interval to a smaller one, and vice versa. Consequently, the advantages of the present invention include: (a) reducing the heavy switching between two adjacent intervals; (b) decreasing the probability of inviting mismatch and noises during switching between two coarse intervals; (c) diminishing the inherently bad effect of the electronic device due to the manufacturing process.

DETAILED DESCRIPTION OF THE PREFERRED EMBODIMENTS

The present invention is directed to an apparatus and a method of switching intervals for reducing heavy switching between two adjacent intervals. The controlling apparatus is capable of precisely aligning the phase of feedback signal to that of the reference signal by a programmable delay circuit in the time domain to save on power consumption of the electronic devices. Moreover, the controlling apparatus implements the controlling method by digital delay-locked loop to avoid the effect of manufacturing process in the electronic devices. It should be noted that the controlling apparatus is suitable for clock source synchronization in the electronic devices, such as a north bridge, a south bridge, and a central processing unit (CPU) or the combination, and also for any type of clock synchronization mechanisms. It should be noted that the predetermined phase angle can be 90, 180 or 270 degrees, or any degree of phase angles.

Figure 1:
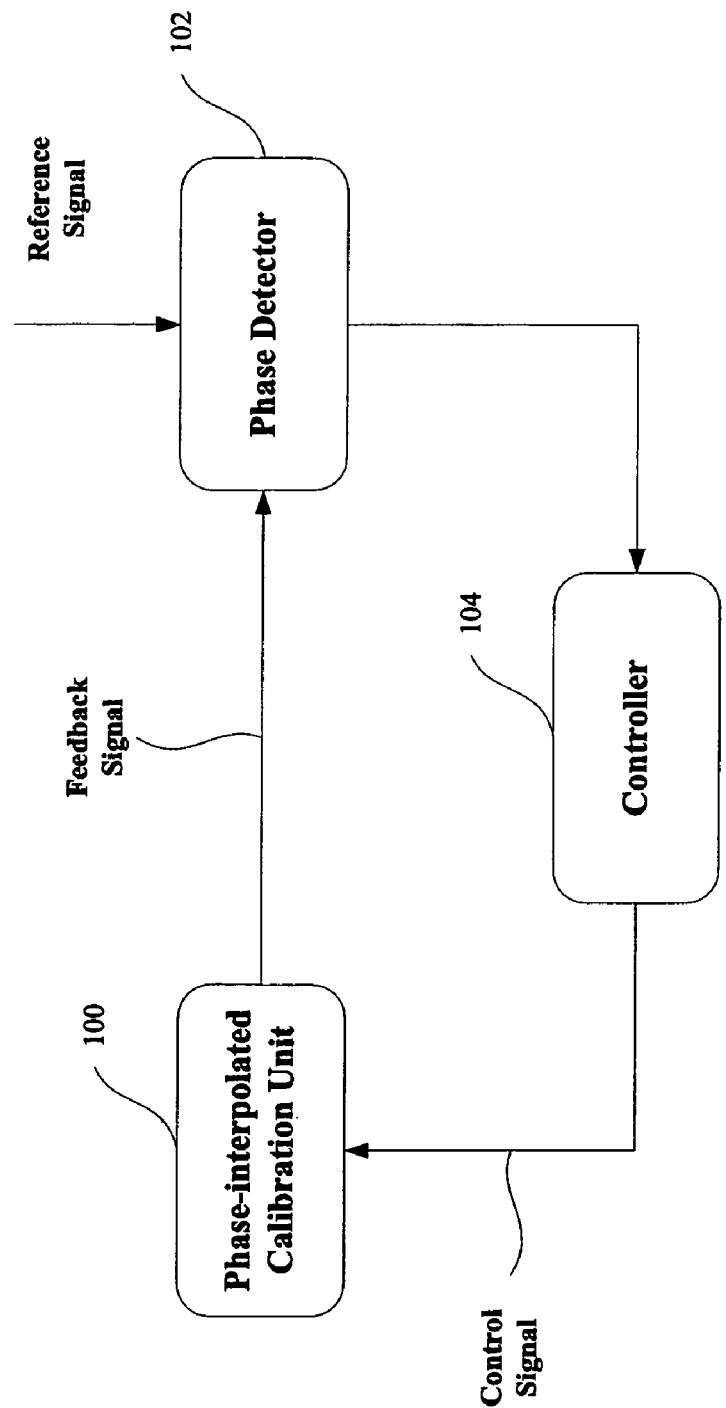
FIG. 1 shows a conventional clock phase alignment in a phase domain for a delay-locked loop.
Figure 2:
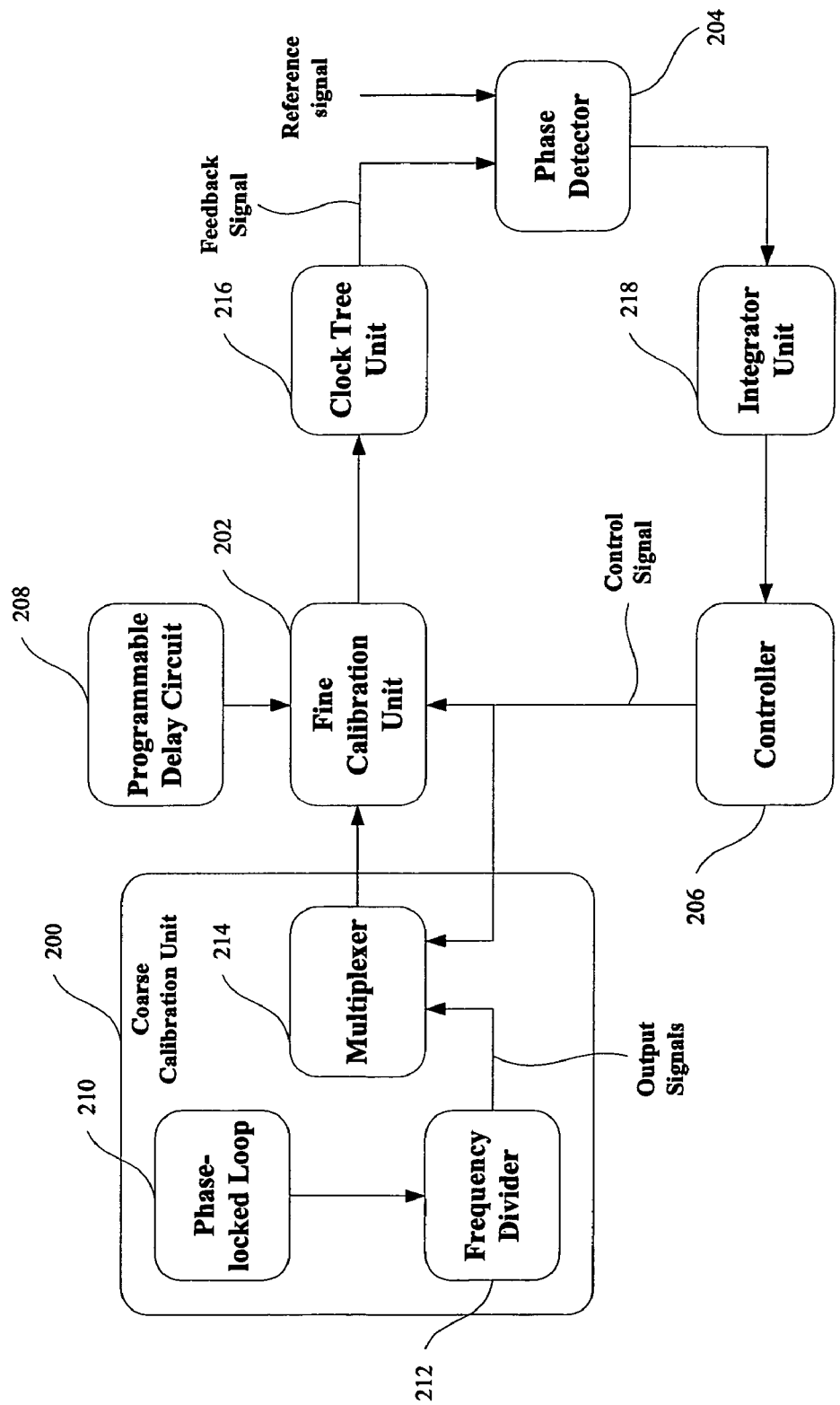
FIG. 2 illustrates a detailed block diagram of an apparatus for reducing heavy switching according to the present invention.

FIG. 2 illustrates a detailed block diagram of an apparatus for reducing heavy switching with a hybrid phase and time domain according to the present invention. The apparatus comprises a coarse calibration unit 200, a fine calibration unit 202, a phase detector 204, and a controller 206. The coarse calibration unit 200 generates a plurality of output signals, the output signals having a plurality of phase intervals therebetween. A predetermined phase angle is divided by the number of the output signals to generate one of the phase intervals. The fine calibration unit 202 connected to the coarse calibration unit 200 delays one of the output signals generated from the coarse calibration unit 200 by coupling to a programmable delay circuit 208 to adjust the phase of a feedback signal toward the phase of reference signal. Specifically, at least on of the phase intervals is fixed or variable phase interval. Moreover, the phase intervals between the output signals cover the predetermined phase angle or a portion of predetermined phase angle.

The phase detector 204 adapted to the fine calibration unit 202 is used to detect a phase difference between the reference and feedback signals and outputting an indicating signal corresponding to the phase difference between the reference and feedback signals. The controller 206 coupled to the coarse calibration unit 200, the fine calibration unit 202, and the phase detector 204 controls the coarse calibration unit 200 and the fine calibration unit 202 to align the feedback signal to the reference signal according to the indicating signal from the phase detector 204.

Referring to FIG. 2 again, the coarse calibration unit 200 comprises a phase-locked loop 210, a frequency divider 212, and a multiplexer 214. The phase-locked loop 210 generates a plurality of multiplying frequency signals. The frequency divider 212 coupled to the phase-locked loop 210 divides the multiplying frequency signals into the output signals. The multiplexer 214 adapted to the frequency divider 212 and the controller 206 is used to select one of the output signals to be output into the fine calibration unit 202 according to a control signal from the controller 206.

Further, a clock tree unit 216 coupled to the fine calibration unit 202 and the phase detector 204 is used to amplify the feedback signal from the fine calibration unit 202. Preferably, an integrator 218 is located between the phase detector 204 and the controller 206 for integrating the indicating signal from the phase detector 204 in order to filter out the noises in the loop.

Figure 3A:
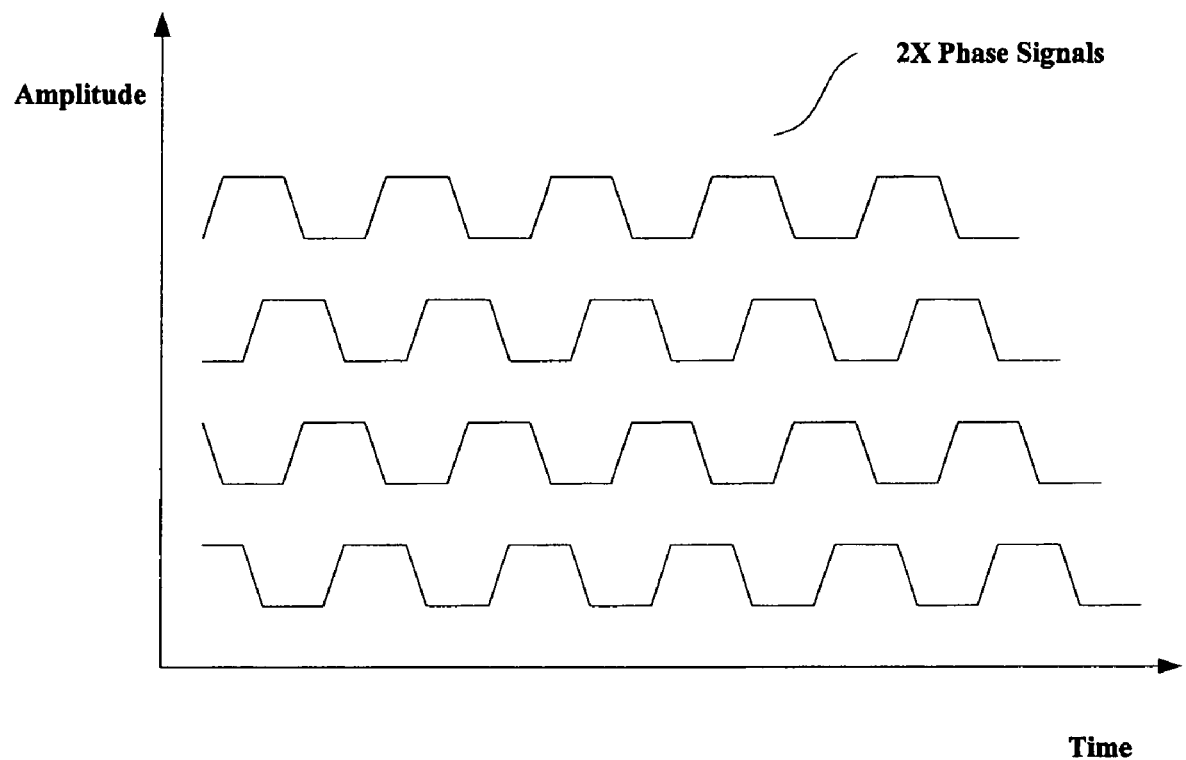
FIGS. 3A and 3B illustrate a timing diagram of multiplying frequency signals of coarse calibration unit in FIG. 2 according to one embodiment of the present invention.
Figure 3B:
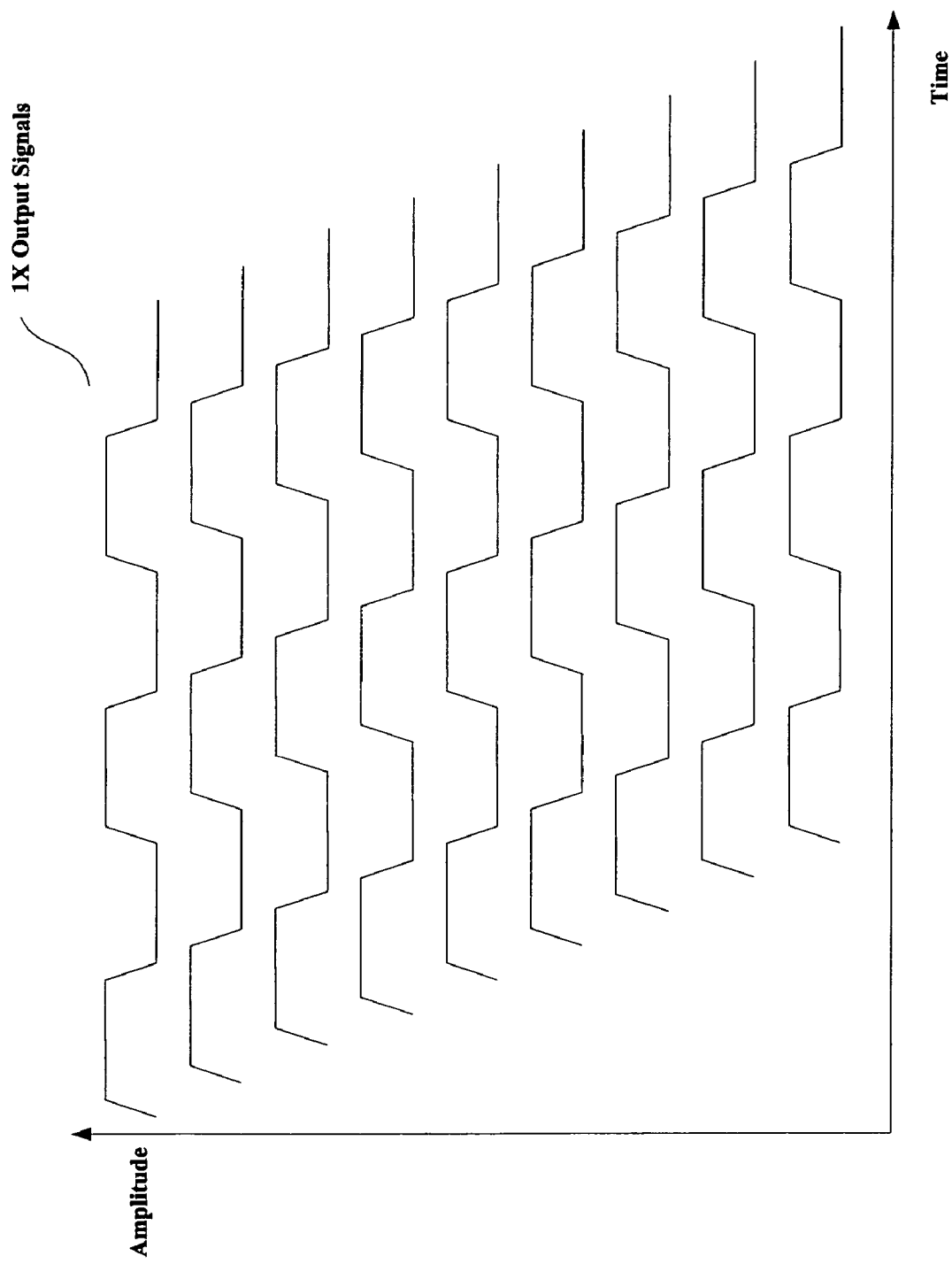

FIGS. 3A and 3B illustrate a timing diagram of multiplying frequency signals of coarse calibration unit in FIG. 2 according to one embodiment of the present invention. In this embodiment, four different phase signals are generated by 2× PLL, as shown in FIG. 3A. Then, in FIG. 3B, the four different phase signals are divided by the frequency divider 212 to generate eight different output signals, e.g. 1× frequency signals in view of the 2× PLL, in a predetermined phase angle so that the reference signal is located in one of the output signals which serves as different feedback signals. Preferably, the 1× frequency signals can be generated by a delay-locked loop generator. Preferably, the delay-locked loop generator is in reference to U.S. application Ser. No. 10/708,373 filed on Feb. 26, 2004 by the same Assignee for further detailed description. Therefore, the phase difference between a reference signal and a feedback signal is coarsely adjusted to rapidly select a phase interval in the phase domain for the reference signal by covering the predetermined phase angle in the phase domain.

Figure 4A:
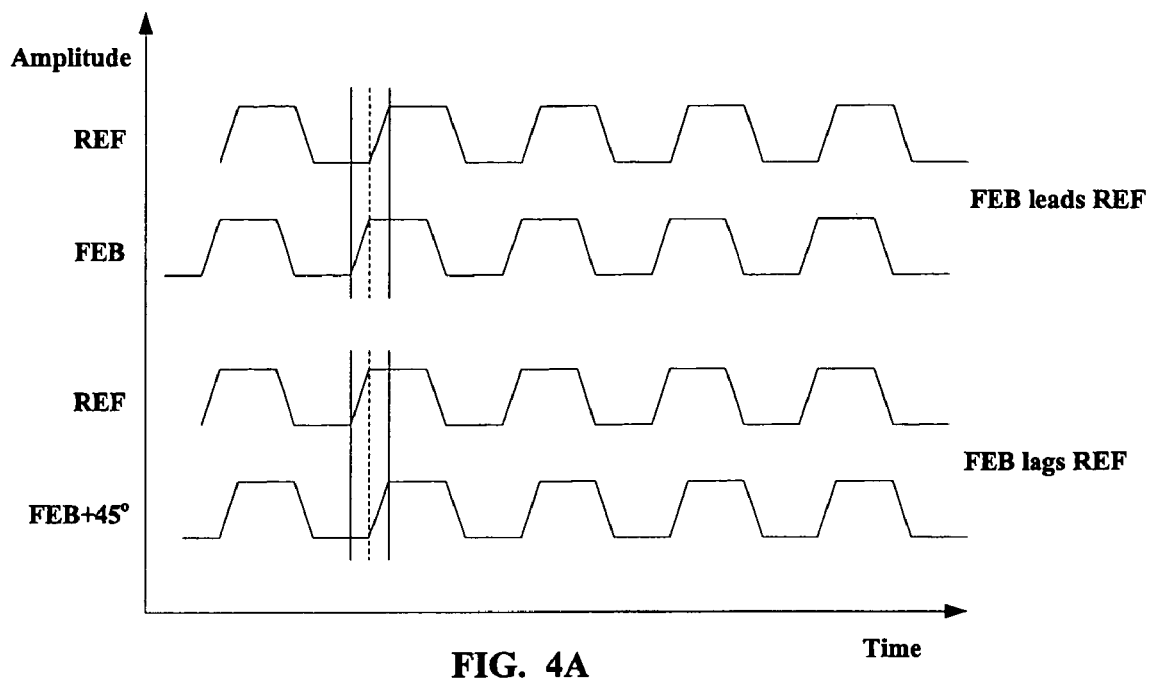
FIGS. 4A and 4B illustrate a timing diagram of a plurality of output signals of the coarse calibration unit in FIG. 2 according to one embodiment of the present invention.
Figure 4B:
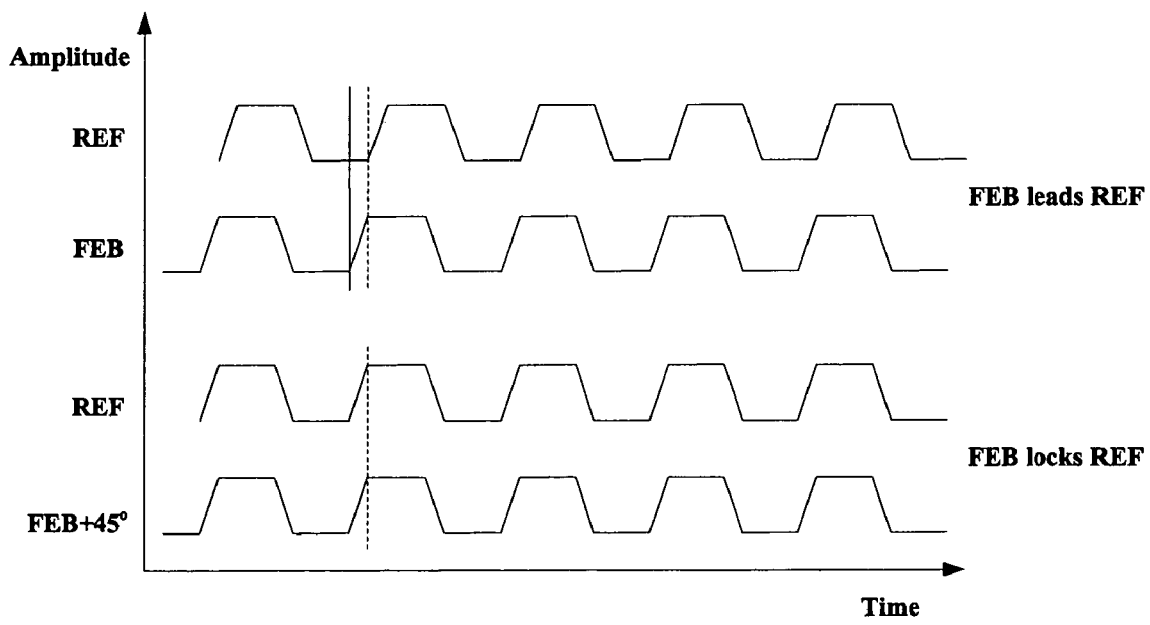

FIGS. 4A and 4B illustrate a timing diagram of a plurality of output signals of the coarse calibration unit in FIG. 2 according to one embodiment of the present invention. The feedback signal is coarsely tuned in the phase intervals which cover the predetermined phase angle and the tuned feedback signal is selected from the phase intervals in the coarse calibration unit to serves as an input signal to the fine calibration unit 202. The coarse calibration unit 200 is measured by an angular magnitude in the phase domain. In FIG. 4A, one of the output signals from the coarse calibration unit 200 is selected as the feedback signal and then is increased by the phase interval, e.g. 45 degrees, via the controller to repeatedly compare the reference signal with the feedback signals, respectively so that the phase of the reference signal is from a lead status to a lag status with respect to the feedback signal.

In FIG. 4B, one of the output signals from the coarse calibration unit 200 is selected as the feedback signal and then is increased by the phase interval, e.g. 45 degrees, so that the phase of the reference signal is from a lead status to a lock status with respect to the feedback signal. In other words, the reference signal is located between the lead and the lag or the lock output signal. As a result, in the present invention, the controller rapidly identifies the phase interval of the reference signal by coarsely adjusting in the different output signals to select one of the fine calibration unit. In one embodiment, the phase comparison between the reference signal and the feedback signal in the coarse calibration unit 200 is preferably implemented by flip-flop components and delay circuits.

Figure 5A:
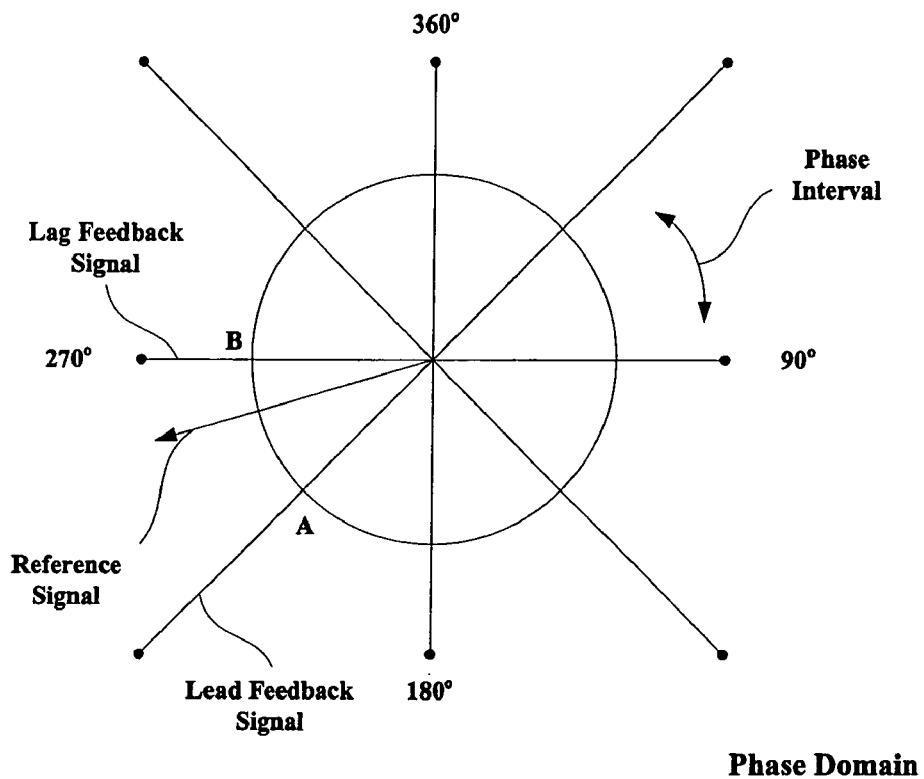
FIG. 5A illustrates the reference and feedback signals located in the complete 360 degrees represented by a phase domain having a plurality of phase intervals according to one embodiment of the present invention.
Figure 5B:
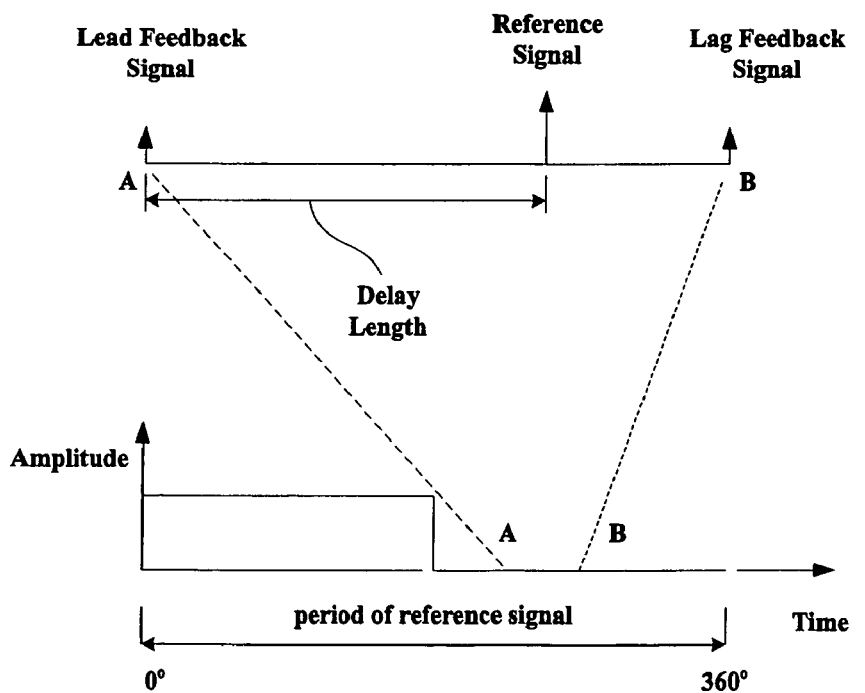
FIG. 5B illustrates the reference and feedback signals located in a phase interval represented by a time domain in the first fine calibration unit according to the present invention.

FIG. 5A illustrates the reference and feedback signals located in the predetermined phase angle represented by a phase domain having a plurality of phase intervals according to the present invention. FIG. 5B illustrates the reference and feedback signals located in a phase interval represented by a time domain in the fine calibration unit according to the present invention.

In FIG. 5A, the predetermined phase angle with the reference signal is divided into a plurality of phase intervals. In this embodiment, the reference signal is located in one of the phase intervals and the reference signal in the phase domain is measured by angular magnitude. Thus, the reference signal can always be detected by the controller since the predetermined phase angle is continuous.

In FIG. 5B, the phase interval of the reference signal in FIG. 5B is represented in a time domain. In this embodiment, the reference signal located in the phase interval is measured by a delay length generated by the programmable delay circuit in the time domain. Specifically, the position of the reference signal in the phase domain is mapped to the time domain to precisely adjust the feedback signal toward the reference signal.

As a result, the clock phase alignment between the reference signal and the feedback signal is performed by a dual loop, i.e. a phase and a time domain. In the phase domain of the coarse calibration unit, the phase difference between a reference signal and a feedback signal is coarsely adjusted to rapidly select a phase interval in the phase domain for the reference signal by covering the predetermined phase angle in the phase domain. In the time domain of the fine calibration unit, the phase of feedback signal to that of the reference signal is precisely aligned by a programmable delay circuit in a time domain to save on the power consumption of the electronic devices. Furthermore, the components of the controlling apparatus are digitally implemented by synthesis design tools to considerably reduce the size of the circuit.

In one embodiment of the present invention, the delay length of the programmable delay circuit of the first fine calibration unit is at least 1/N time the period of the reference signal to span at least one phase interval, where N is the number of output signals. Preferably, the delay length of the first fine calibration unit is at least 1.5/N or 2.0/N times the period of the reference signal to effectively exceed the cover range of one phase interval.

Figure 6:
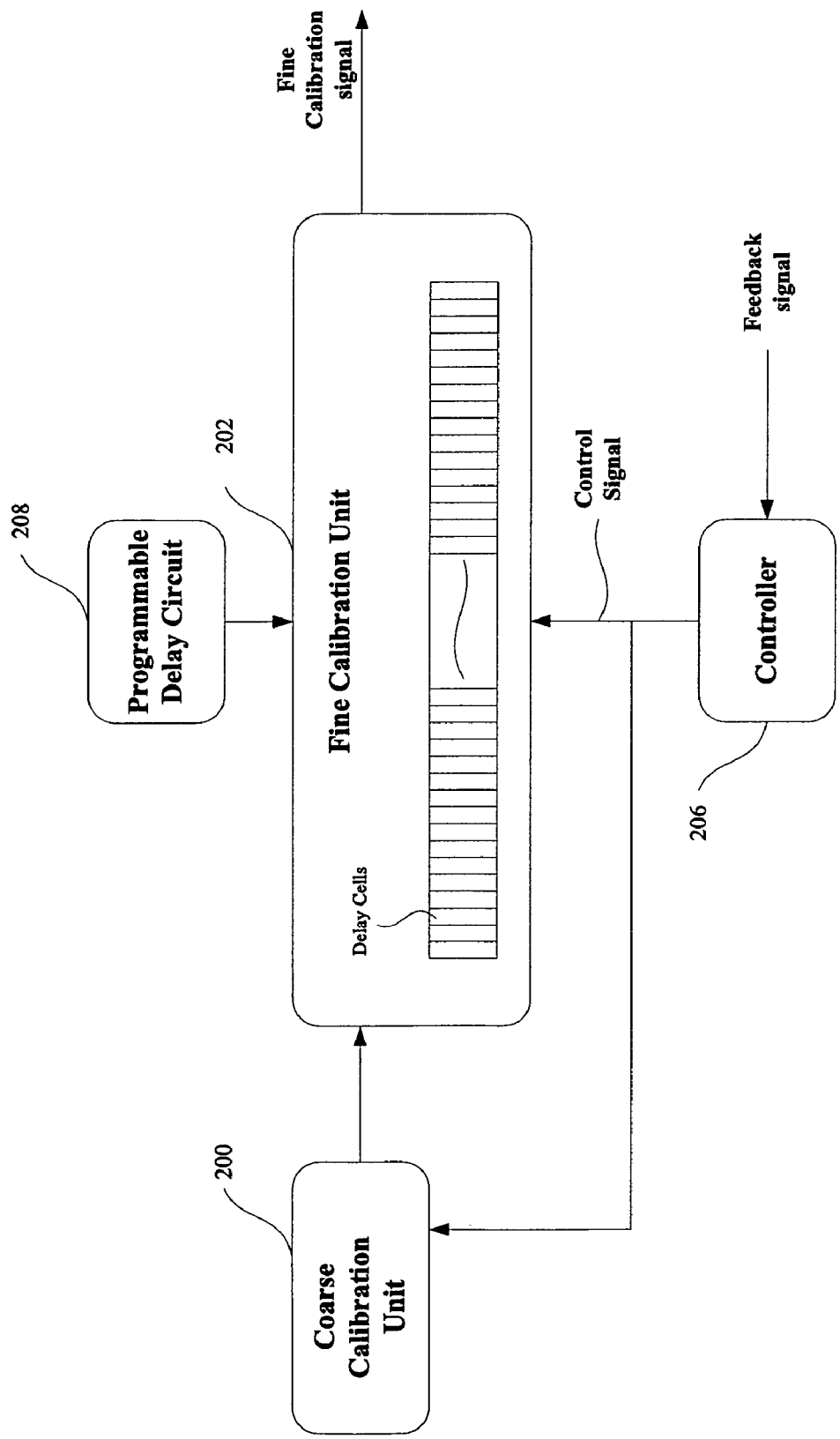
FIG. 6 shows a more detailed block diagram of the fine calibration unit according to the present invention.

FIG. 6 illustrates a more detailed block diagram of the fine calibration unit in accordance with the present invention. The fine calibration unit 202 comprises a plurality of delay cells. The number of delay cells is preset in the fine calibration unit of the apparatus. Each delay cell is capable of representing a fine interval within a phase interval. The fine calibration unit 202 receives the output signals from the coarse calibration unit 200 to determine which the specific phase interval the reference signal is located in. The fine calibration unit 202 also receives the control signals from the controller 206 to determine whether the feedback signal is aligned with the reference signal. The fine calibration will add one delay length in time domain to the feedback signal each time when the feedback signal lags the reference signal. On the contrary, the fine calibration will subtract one delay length in time domain from the feedback signal each time when the feedback signal leads the reference signal. It will be repeated over and over until the feedback signal locks the reference signal.

Figure 7A:
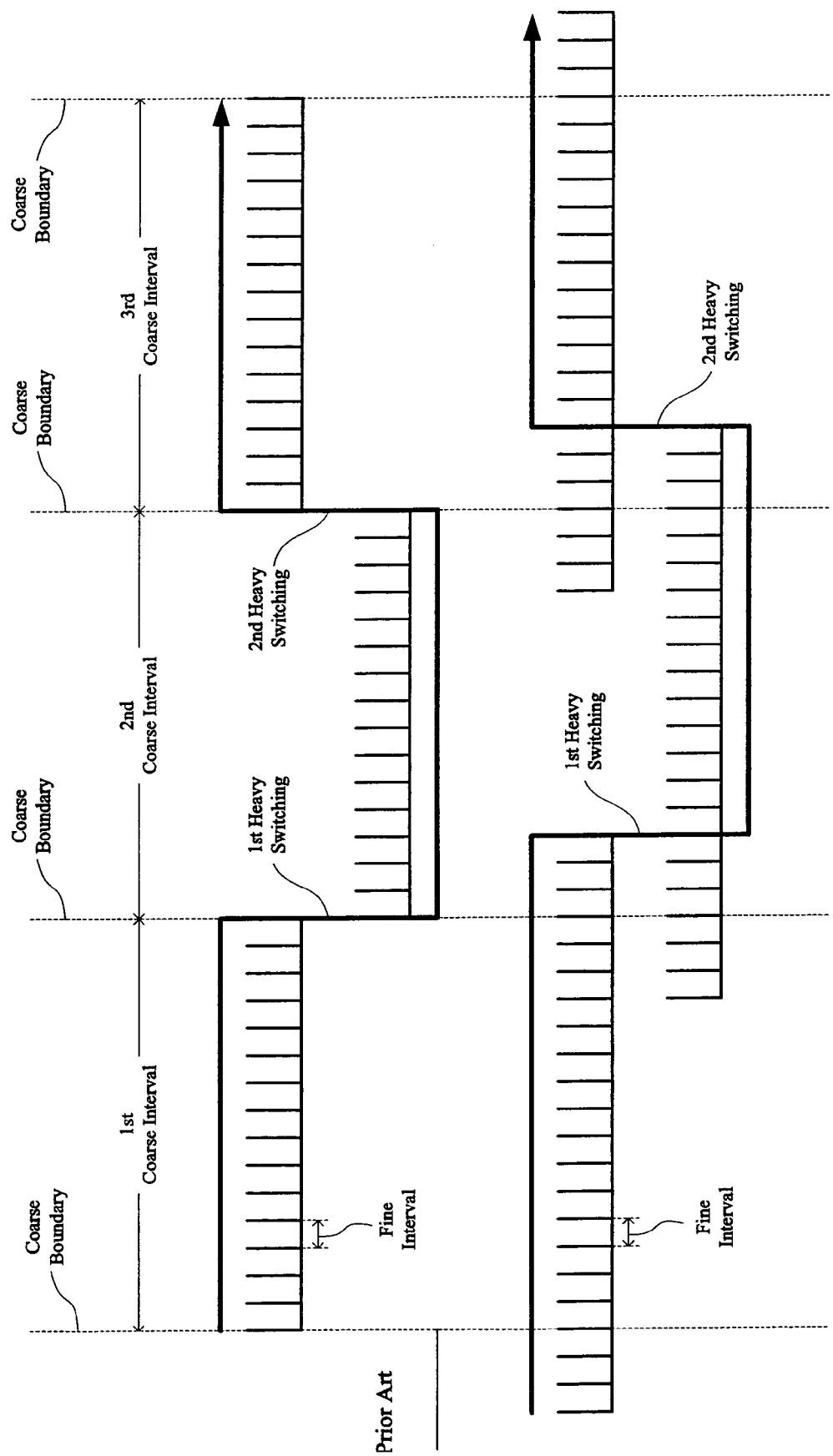
FIGS. 7A and 7B illustrate the schematic diagrams of the usage of delay cells in accordance with the present invention.
Figure 7B:
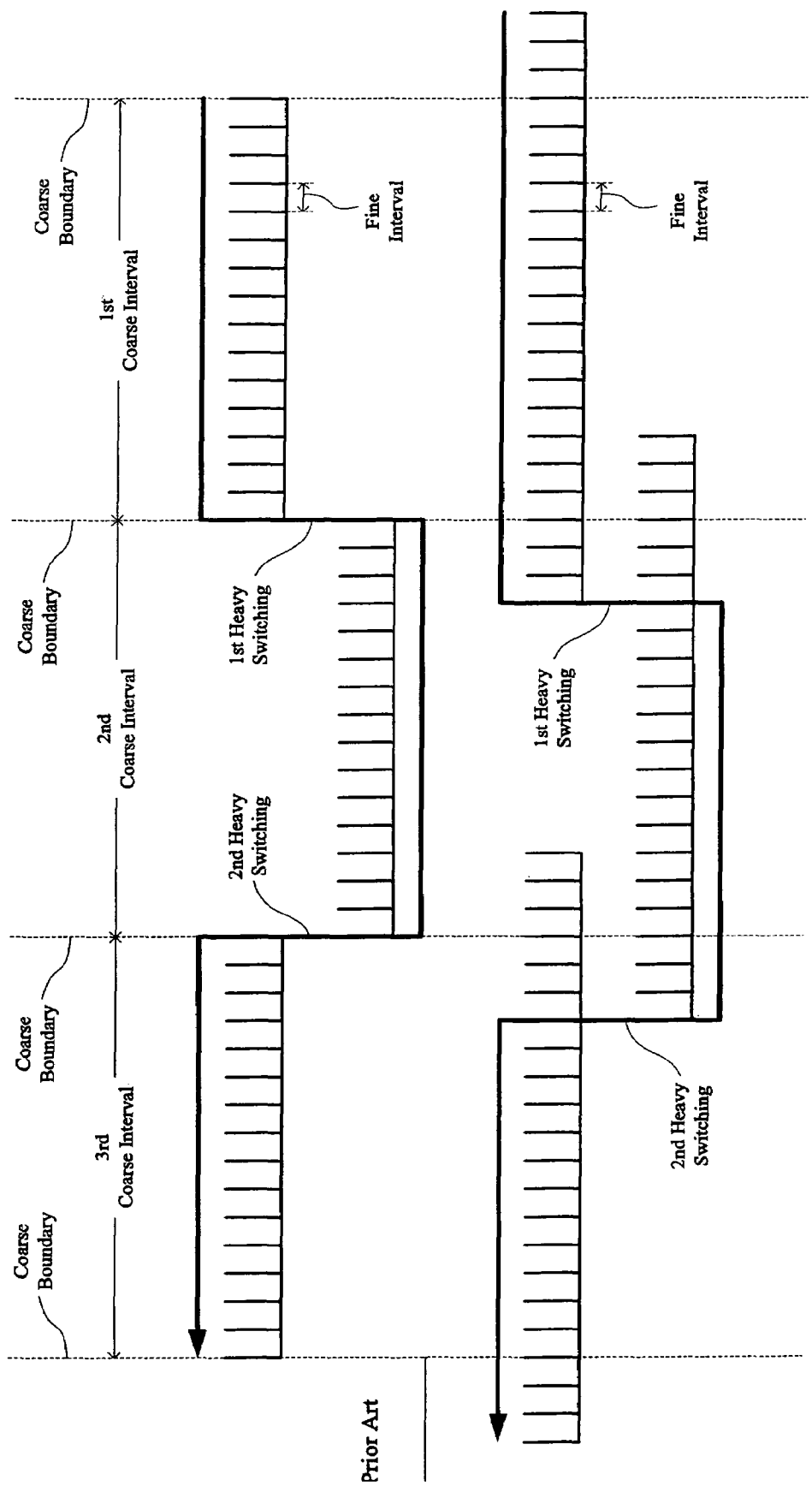

FIGS. 7A and 7B show the embodiment of switching between two adjacent coarse intervals, i.e. phase interval, of the present invention which is compared to that of the conventional way. Conventionally, each coarse interval comprises a predetermined number of fine intervals, i.e. delay length. The total length of the predetermined number of fine intervals in prior art are just equal to the length of one coarse interval. Therefore, a heavy switching between two adjacent coarse intervals will occur when the reference signal is found which drifts into another coarse interval. It causes that the heavy switching occurs frequently in the conventional way. The present invention provides a way of hysteretic switching for efficiently reducing the heavy switching between two adjacent coarse intervals.

Please be referred to the bottom half of FIGS. 7A and 7B. The present invention disposes a number of the fine intervals to cover a range which is larger than the length of one coarse interval. In this embodiment, each coarse interval comprises three extra fine intervals which are exceeded the boundary of the coarse intervals in one side. The heavy switching will be postponed until the extra fine intervals are used up. In the meantime, the fine calibration unit records the number of extra fine interval which be used. An extra-boundary value will be recorded in the fine calibration unit for determining an initial fine interval in another coarse interval if the heavy switching occurs. It should be noted that the extra-boundary value could be a positive or minus value corresponding to which a forward coarse interval or a backward coarse interval the reference signal drifts into. The heavy switching will occur frequently while a signal jitter just occurs close to a boundary of coarse intervals. The signal jitter means that the phase of signal drifts. In accordance with the present invention, it will switch between two fine intervals instead of switching between to coarse interval when the signal jitter occurs close to a boundary of coarse intervals. Therefore, it is obviously that the probability of the heavy switching occurring will be efficiently decreased by the way of hysteretic switching of the present invention. Furthermore, the mismatch and noises due to the heavy switching between the coarse intervals can be effectively diminished.

Figure 8:
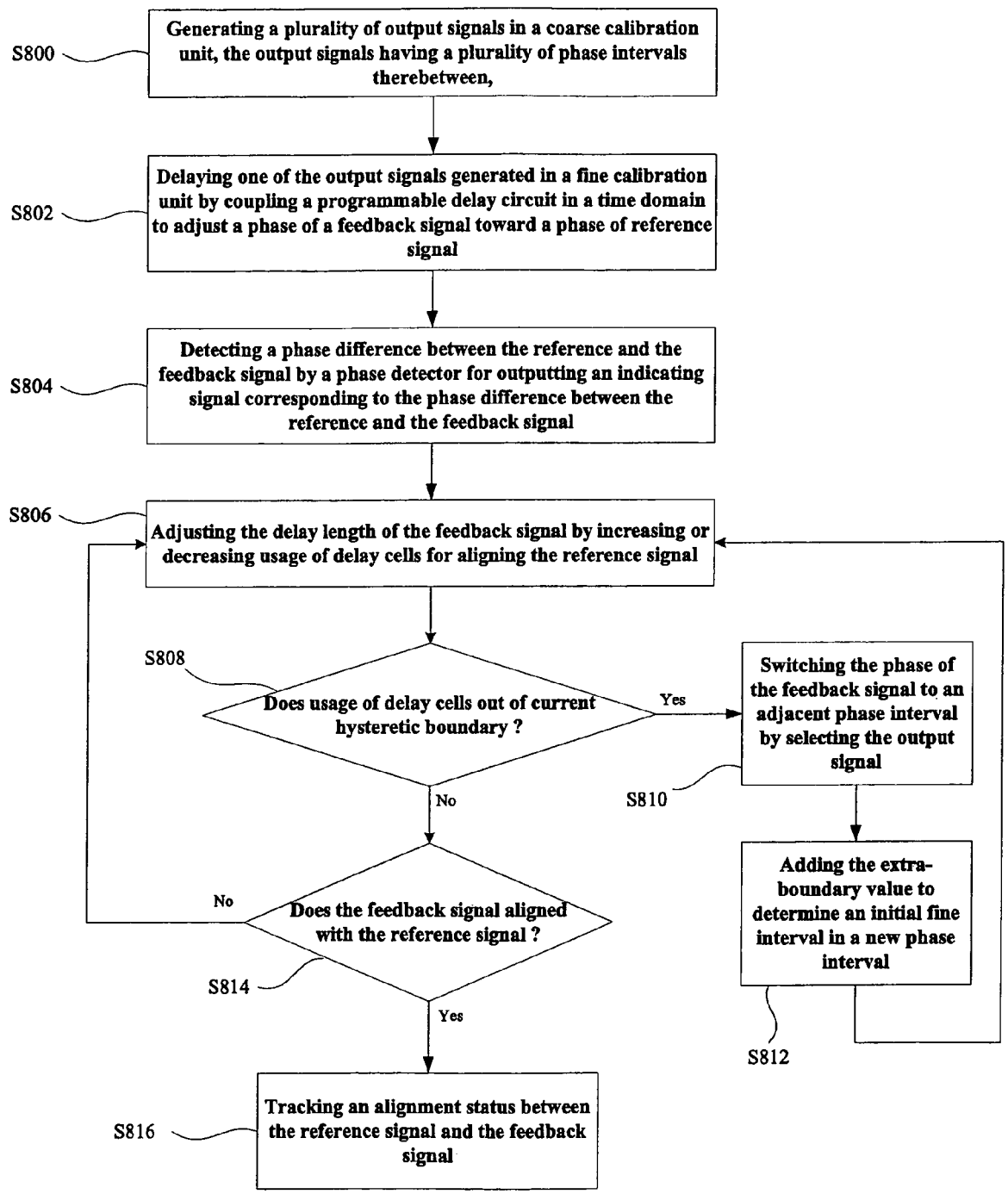
FIG. 8 shows a flow chart of the method of reducing heavy switching according to the present invention.

FIG. 8 shows a flow chart of the method for reducing heavy switching according to the present invention. The method comprises following steps of:

S800 Generating a plurality of output signals in a coarse calibration unit and every two output signals have a phase interval therebetween. A predetermined phase angle is divided by the number of the output signals to generate one of the phase intervals in a phase domain. The phase of the feedback signal is in an ascending order of increase from 0 degree or a descending order of decrease from 360 degrees by the phase interval. Then, the controller repeatedly compares the phase of the reference signal with that of the feedback signals, respectively. During the step of increasing the phase of the feedback signal by the phase interval, the comparison results between the reference and feedback signals from the phase detector are recorded by the controller. When the comparison results between the reference signal and feedback signal are changed from a lead status into a lag or a lock status, the feedback signal is selected from the phase intervals for transmitting the output signal into the fine calibration unit. Preferably, the phase of the feedback signal is decreased by the phase interval to select the output signal which leads the reference signal as the feedback signal in the phase interval.

S802 The output signal generated in a fine calibration unit is delayed by coupling a programmable delay circuit in a time domain to adjust a phase of a feedback signal toward a phase of reference signal. Specifically, during the step S802, a delay length generated by the programmable delay circuit is added to the feedback signal when the feedback signal leads the reference signal. Person skilled in the art should know that the delay length can be added in a clockwise or counterclockwise direction. The feedback signal is subtracted by a delay length when the feedback signal lags the reference signal. The delay length keeps constant when the feedback signal locks the reference signal. The delay length is determined by usage of a number of delay cells in the fine calibration unit. In other words, the longer delay length represents a usage of more delay cells.

S804 The phase difference between the reference signal and the feedback signal is detected by a phase detector for outputting an indicating signal corresponding to the phase difference between the reference and feedback signals.

S806 The controller is capable of generating the control signals to the coarse calibration unit and the fine calibration unit for adjusting the delay length of the feedback signal according to the indicating signal from the phase detector. The delay length of the feedback signal is adjusted by increasing or decreasing the usage of the number of delay cells in the fine calibration unit.

S808 Determining whether the usage of delay cells is out of current hysteretic boundary of coarse interval. The range between two hysteretic boundaries is larger than a coarse interval, i.e. phase interval, because the present invention uses more fine intervals to cover a coarse interval. The heavy switching will be postponed until the extra fine intervals are used up. In the meantime, the fine coarse unit records an extra-boundary value according to how many number of the extra fine intervals be used. The extra-boundary value is used to find an initial fine interval of a next adjacent coarse interval. If the usage of delay cells is out of current hysteretic boundary of coarse interval, go forward to step S810, otherwise go forward to step S814.

S810 Switching the phase of the feedback signal to an adjacent phase interval by selecting one of the output signals from the coarse calibration unit. The phase of the reference signal will be determined to drift into another coarse interval when the extra fine intervals are used up. Therefore, the phase of the feedback signal has to switch into the coarse interval which the reference signal is located in.

S812 Adding the extra-boundary value to the new coarse interval of the feedback signal for compensating the extra fine intervals have been used in the former coarse interval. The extra-boundary value can be used to determine the initial fine interval in the new coarse interval of the feedback signal for repeatedly aligning the feedback signal with the reference signal. After the step S812, the procedure will go backward to the step S806 for continue the alignment of the feedback and the reference signals.

S814 Determining whether the feedback signal locks the reference signal. The feedback signal will be determined in a lock status when it is found that the feedback signal is aligned with reference signal.

S816 After the feedback signal locks the reference signal, the controller will still monitor an alignment status between the reference and feedback signals continuously.

The present invention provides an apparatus and a method of switching intervals for reducing the heavy switching between two adjacent coarse intervals by using the way of hysteretic switching. The apparatus and a method according to the present invention are capable of reducing the risk of inviting mismatch and noises during every heavy switch between two coarse intervals. The present invention is capable of reducing the probability of the heavy switching occurs due to the signal jitter occurs close to a boundary of coarse intervals. Further, the apparatus of the present invention will not need to increase additional devices because the delay cells already exist in the fine calibration unit and the number of the delay cells does not need to increase. Thus, the present invention can improve the performance of the electronic device without additional costs.

The advantages of the present invention include: (a) reducing the heavy switching between two adjacent intervals; (b) decreasing the probability of inviting mismatch and noises during switching between two coarse intervals; (c) diminishing the inherently bad effect of the electronic device due to the manufacturing process.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. An apparatus of switching intervals, the apparatus comprising:
    a coarse calibration unit, generating a plurality of coarse intervals, wherein a predetermined phase angle is divided by the number of the coarse intervals;
    a fine calibration unit adapted to the coarse calibration unit and having a plurality of delay cells coupled to the coarse interval for adjusting a feedback signal to be aligned to a reference signal;
    a phase detector adapted to the fine calibration unit, detecting a phase difference between the feedback signal and the reference signal; and
    a controller, controlling the coarse calibration unit and the fine calibration unit to align the feedback signal to the reference signal according to a phase difference between the feedback and the reference signals;
    wherein each delay cell represents a fine interval for dividing the coarse interval into a plurality of smaller intervals, a predetermined set of fine intervals is used to cover one coarse interval, and a range of the predetermined set of fine intervals is larger than that of one coarse interval, the controller switches the feedback signal from a current coarse interval into another coarse interval when the predetermined set of fine intervals is used up before the feedback signal is aligned to the reference signal.

2. The apparatus of claim 1, wherein the coarse calibration unit comprises:
    a phase-locked loop, generating a plurality of multiplying frequency signals;
    a frequency divider coupled to the phase-locked loop, dividing the multiplying frequency signals into the output signals; and
    a multiplexer coupled to the frequency divider and the controller, selecting one of the output signals to be output into the fine calibration unit according to a control signal from the controller.

3. The apparatus of claim 1, wherein the coarse calibration unit is measured by an angular magnitude in a phase domain.

4. The apparatus of claim 1, wherein the feedback signal is coarsely tuned in the coarse intervals covering the predetermined phase angle and the tuned feedback signal is selected from the coarse intervals in the coarse calibration unit to serve as an input signal to the fine calibration unit.

5. The apparatus of claim 1, further comprising a programmable delay circuit coupled to the fine calibration unit, adjusting the phase of the feedback signal in a time domain, wherein the fine calibration unit is measured by a delay length generated by the programmable delay circuit in a time domain and the delay length is determined a usage of a number of the fine interval.

6. The apparatus of claim 5, wherein the delay length of the fine calibration unit is at least 1/N time the period of the reference signal and N is the number of the output signals.

7. The apparatus of claim 6, wherein the delay length of the fine calibration unit is at least 1.5/N time the period of the reference signal.

8. The apparatus of claim 6, wherein the delay length of the fine calibration unit is at least 2.0/N time the period of the reference signal.

9. The apparatus of claim 1, wherein at least one of the fine intervals is a fixed phase interval.

10. The apparatus of claim 1, wherein at least one of the fine intervals is variable phase interval.

11. The apparatus of claim 1, wherein the predetermined phase angle is complete 360 degrees.

12. The apparatus of claim 1, wherein the current coarse interval and another coarse interval are adjacent to each other.

13. A method of switching intervals, the switching method comprising the steps of:
    generating a plurality of output signals in a coarse calibration unit, each two of the output signals having a coarse interval therebetween, wherein a predetermined phase angle is divided by the number of the output signals to generate one of the coarse intervals in a phase domain;
    delaying one of the output signals generated in a fine calibration unit by coupling a programmable delay circuit in a time domain to adjust a phase of a feedback signal toward a phase of a reference signal;
    detecting a phase difference between the reference signal and the feedback signal by a phase detector for outputting an indicating signal corresponding to the phase difference between the reference signal and the feedback signal; and
    adjusting a delay length of the feedback signal by using a number of delay cells in the fine calibration unit according to the indicating signal, wherein each delay cell represents a fine interval for dividing the coarse interval and a set of fine intervals covers a range which is larger than a range of one coarse interval;
    determining whether the usage of delay cells is out of a current hysteretic boundary of the coarse calibration units;
    switching the phase of the feedback signal to another coarse interval;
    adding an extra-boundary value generated by the fine calibration unit to the another coarse interval for determining an initial fine interval in the another coarse interval; and
    determining whether the feedback signal is aligned with the reference signal.

14. The method of claim 13, wherein the delay length is generated by the programmable delay circuit coupled to the fine calibration unit in a time domain.

15. The method of claim 13, during the step of adjusting a delay length of the feedback signal, a delay length is added to the feedback signal when the feedback signal leads the reference signal during the step of detecting a phase difference between the reference signal and the feedback signal.

16. The method of claim 13, during the step of adjusting a delay length of the feedback signal, a delay length is subtracted from the feedback signal when the feedback signal lags the reference signal during the step of detecting a phase difference between the reference signal and the feedback signal.

17. The method of claim 13, during the step of adjusting a delay length of the feedback signal, a delay length keeps constant when the feedback signal locks the reference signal during the step of detecting a phase difference between the reference signal and the feedback signal.

18. The method of claim 13, after the step of determining whether the feedback signal is aligned with the reference signal, further comprising a step of tracking an alignment status between the reference signal and the feedback signal when the feedback signal locks the reference signal.

19. The method of claim 13, wherein the extra-boundary value is a positive value.

20. The method of claim 13, wherein the extra-boundary value is a minus value.

21. The method of claim 13, wherein the delay length of the programmable delay circuit is at least 1/N time the period of the reference signal and N is the number of the output signals.

22. The method of claim 21, wherein the delay length of the programmable delay circuit is at least 1.5/N time the period of the reference signal.

23. The method of claim 21, wherein the delay length of the programmable delay circuit is at least 2/N time the period of the reference signal.

24. The method of claim 13, wherein the coarse interval and the another coarse interval are adjacent to each other.

25. A method of switching intervals, the switching method comprising the steps of:
- generating a plurality of coarse intervals in a coarse calibration unit, wherein a predetermined range is divided by the number of the coarse intervals;
- generating a plurality of fine intervals in a fine calibration unit, wherein a set of fine intervals covers a range which is larger than one coarse interval, the set of fine intervals comprises at least one extra fine interval which is out of a boundary between at least two coarse intervals;
- selecting one of the coarse intervals;
- determining whether the extra fine interval is used up; and
- switching to another coarse interval when the extra fine interval is used up.

26. The method of claim 25, before the step of switching to another coarse interval, further comprising a step of recording an extra-boundary value by the fine calibration unit.

27. The method of claim 26, after the step of switching to another coarse interval, further comprising a step of adding the extra-boundary value to the another coarse interval for determining an initial fine interval of the another coarse interval.

28. The method of claim 26, wherein the extra-boundary value is a positive value.

29. The method of claim 26, wherein the extra-boundary value is a minus value.

30. The method of claim 25, wherein the at least two coarse intervals are adjacent to each other.

\* \* \* \* \*

UNITED STATES PATENT AND TRADEMARK OFFICE
CERTIFICATE OF CORRECTION

PATENT NO. : 7,603,095 B2  Page 1 of 1
APPLICATION NO. : 11/356931
DATED : October 13, 2009
INVENTOR(S) : Yang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 910 days.

Signed and Sealed this

Fifth Day of October, 2010

David J. Kappos
*Director of the United States Patent and Trademark Office*